United States Patent [19]

Medulla et al.

[11] Patent Number: 5,497,005
[45] Date of Patent: Mar. 5, 1996

[54] METHOD AND APPARATUS FOR PRODUCING A STREAM OF IONIC ALUMINUM

[75] Inventors: Candido Medulla, Trecastagni (CT); Mario Raspagliesi, S.Giovanni La Punta (CT), both of Italy

[73] Assignee: Consorzio per la Ricerca sulla Microelettronica nel Mezzogiorno, Catania, Italy

[21] Appl. No.: 280,759

[22] Filed: Jul. 26, 1994

[51] Int. Cl.$^6$ .................................................... H01J 27/00
[52] U.S. Cl. ................... 250/423 R; 250/424; 250/426; 250/427; 250/442.2
[58] Field of Search ............................ 250/492.2, 423 R, 250/424, 426, 427, 492.21; 315/111.81, 111.21, 111.41; 313/231.41, 231.31

[56] References Cited

U.S. PATENT DOCUMENTS 5,262,652  11/1993  Bright et al. ..................... 250/423 R

FOREIGN PATENT DOCUMENTS

| 0439220 | 7/1991 | European Pat. Off. ......... H01J 37/08 |
| WO-A- 9106969 | 5/1991 | WIPO .............................. H01J 27/22 |

OTHER PUBLICATIONS

Patent Abstracts of Japan, vol. 10, No. 50 (E-284) Feb. 27, 1986 & JP-A-60205951 (Hitachi).

*Primary Examiner*—Jack I. Berman
*Assistant Examiner*—Kiet T. Nguyen
*Attorney, Agent, or Firm*—David M. Driscoll; James H. Morris

[57] ABSTRACT

The invention relates to a method and a generator for producing an aluminum ion flow, specifically for aluminum ion implantation in the microelectronics industry. The method includes the following steps: (i) supplying a stream of an ionization gas into the ionization chamber; (ii) providing an amount of an aluminum-containing feed material inside the ionization chamber; (iii) generating, within the ionization chamber, an electron flow by supplying an electrode with a large current; (iv) bombarding the ionization gas stream with the electron flow to create a plasma; (v) causing the plasma to attack the feed material so as to become enriched with aluminum ions; (vi) taking the plasma out of the ionization chamber; (vii) removing from the plasma, by application of a magnetic field, those ions which have a significantly different equivalent weight from the equivalent weight of the aluminum ions; all this having selected the ionization gas and feed material such that, in the plasma taken out of the ionization chamber, there will be aluminum ions present along with other ions, all having different equivalent weights from the equivalent weight of the aluminum ions.

9 Claims, 3 Drawing Sheets

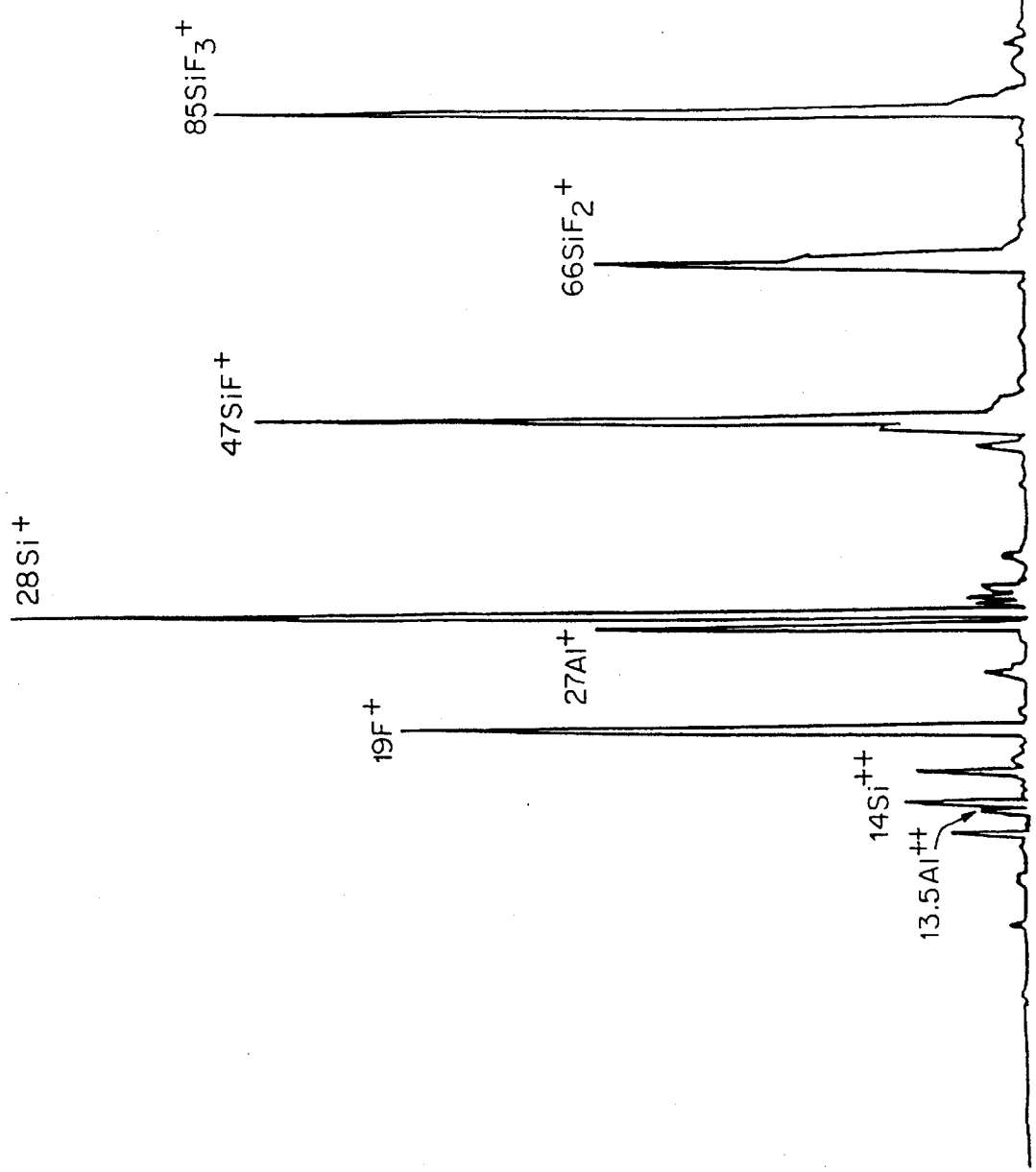

METHOD AND APPARATUS FOR PRODUCING A STREAM OF IONIC ALUMINUM

BACKGROUND OF THE INVENTION

1. Field of the Invention

This invention relates to a method for producing a stream of ionic aluminum, specially intended, for example, for aluminum ion implantation in the microelectronics industry, as well as to a generator implementing the method.

2. Discussion of the Related Art

Ion stream generators are known which include an ionization chamber, a ionization gas inlet line to the ionization chamber, an auxiliary gas inlet line to the ionization chamber, an electrode facing into the ionization chamber and being supplied a sufficiently large current to produce ionization of matter present in the ionization chamber by thermoelectronic effect and consequent formation of a plasma, and an opening in the ionization chamber wherethrough the plasma can be taken out. Such a construction corresponds, for example, to that of the Eaton Nova NV 10-80 apparatus.

The operation of a generator of that kind includes bombarding the ionization gas with an electron flow generated by thermoelectronic effect from the electrode, as supplied with suitably large currents. In this way, a plasma comprising ions at a high temperature is formed within the ionization chamber.

With a generator as outlined above, a plasma stream can be created that includes different ions according to the ionization gases used. It has been found that, occasionally, portions of the generator itself (typically, of the electrode insulating holders) do participate in the ionization phenomenon to release ions into the plasma which originate from the chemical attack that the plasma carries out on the substances with which it comes in contact. An object of the present invention is to produce a stream of aluminum ions, specially useful in the microelectronics industry for the ion implantation of aluminum.

SUMMARY OF THE INVENTION

The idea on which this invention is based is one of providing, inside the ionization chamber, a solid feed material containing aluminum such that, on attack by the plasma, aluminum ions will be released into the plasma.

Therefore, the invention relates, according to one aspect thereof, to a method for producing an aluminum ion stream, intended, for example, for aluminum ion implantation in the microelectronics industry, including, in one embodiment, the steps of:

supplying a stream of an ionization gas into an ionization chamber;

providing an amount of an aluminum-containing feed material inside the ionization chamber;

generating, within the ionization chamber, an electron flow by supplying an electrode with a large current;

bombarding the ionization gas stream with the electron flow to create a plasma;

causing the plasma to attack the feed material so as to become enriched with aluminum ions;

taking the plasma out of the ionization chamber;

removing from the plasma, by application of a magnetic field, those ions which have a significantly different equivalent weight from the equivalent weight of the aluminum ions;

all this having selected the ionization gas and feed material such that, in the plasma taken out of the ionization chamber, there will be aluminum ions present along with other ions, all having different equivalent weights from the equivalent weight of the aluminum ions.

Within this disclosure, Equivalent weight means the ratio of weight to charge of the ions, since it is this ratio that determines the extent of the deflection undergone by each ion in the magnetic field, thereby controlling the ion separation performed by the magnetic field.

The aforesaid method provides a substantially pure aluminum ion stream, suitable for application to aluminum ion implantation in, for example, the microelectronics industry.

The method may be used to provide a stream of aluminum ions having a desired charge, namely ions $Al^+$, $Al^{++}$, or $Al^{+++}$. Of course, additionally to the different energy levels required, because of the different equivalent weights of such ions (equal to 27, 13.5, and 9, respectively), it will be necessary to both control the separation step and select the gases in different ways, so that ions other than the aluminum ions present in the plasma do not have the same equivalent weight as the aluminum ions to be isolated. Preferably, the feed material is alumina, $Al_2O_3$. This material is readily available in a suitable purity grade for such an application.

Preferably, the ionization gas is silicon tetrafluoride, $SiF_4$. This gas can be easily ionized to produce ions $F^+$, $Si^+$, $Si^{++}$, $SiF^+$, $SiF_2^+$, $SiF_3^+$ (having equivalent weights of 19, 28, 14, 47, 66 and 85, respectively). The plasma yielded by the ionization can attack the alumina dioxide to produce ions $Al^+$, $Al^{++}$, and $Al^{+++}$ which join the other ions in the plasma.

To quantitatively improve the production of aluminum ions, this method further preferably includes a step of concentrating the plasma at the feed material inside the ionization chamber.

Preferably, to enhance the energy input and hence the ionization, the method further includes a step of accelerating the electron flow by biasing the walls of the ionization chamber positively with respect to the electrode.

In a second aspect, the invention relates to a generator of an aluminum ion stream, intended, for example, for aluminum ion implantation in the microelectronics industry, including:

an ionization unit;

an ionization chamber within the ionization unit;

a plate of a feed material removably supported inside the ionization chamber;

an ionization gas inlet line to the ionization chamber;

an electrode facing into the ionization chamber and adapted to be supplied a sufficiently large current to cause ionization of the substances present in the ionization chamber and consequent formation of a plasma;

an opening for taking the plasma out of the ionization chamber; and a selection path for the plasma thus taken out, lying through a magnetic field to separate ions with different equivalent weights within the plasma.

Preferably, the feed material includes of a plate secured detachably inside the ionization chamber.

Preferably, the generator includes a negatively biased repel plate mounted inside the ionization chamber on the remote side thereof from the electrode, the feed material being located, for example, in a central area of the ionization chamber between the electrode and the repel plate. In this way, the plasma can be concentrated toward the area where the feed material is located, thereby enhancing the ionization of the latter.

Further features and advantages of the method and a generator according to the invention will become apparent from the following detailed description, given with reference to the accompanying drawings.

BRIEF DESCRIPTION OF THE DRAWINGS

In the drawings:

FIG. 3 is a graph representing a mass spectrography analysis of the plasma produced by the generator of FIG. 1 when operated in accordance with the inventive method.

DETAILED DESCRIPTION

Figure 1:
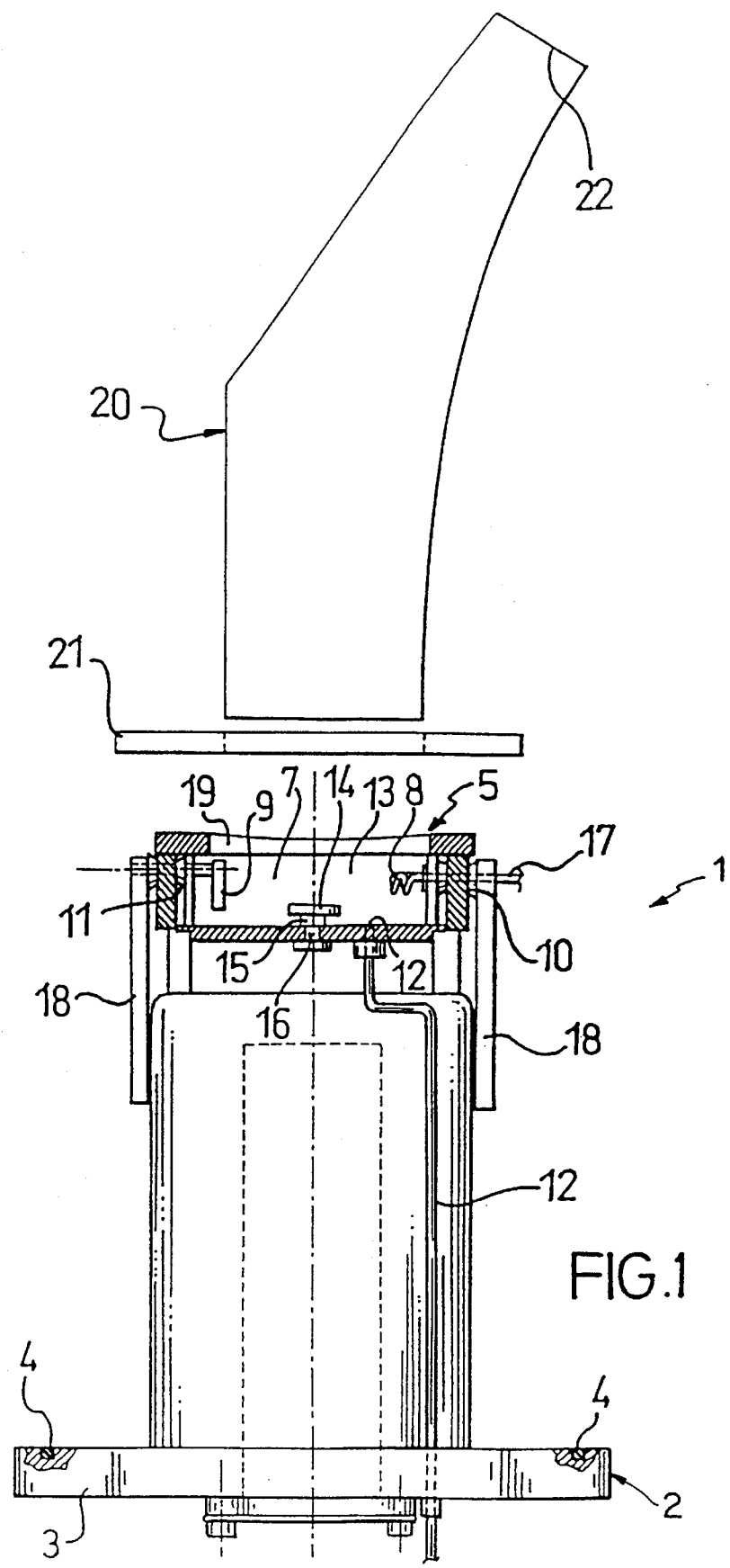
FIG. 1 is a front view showing schematically and in cross-section a generator according to the invention.
Figure 2:
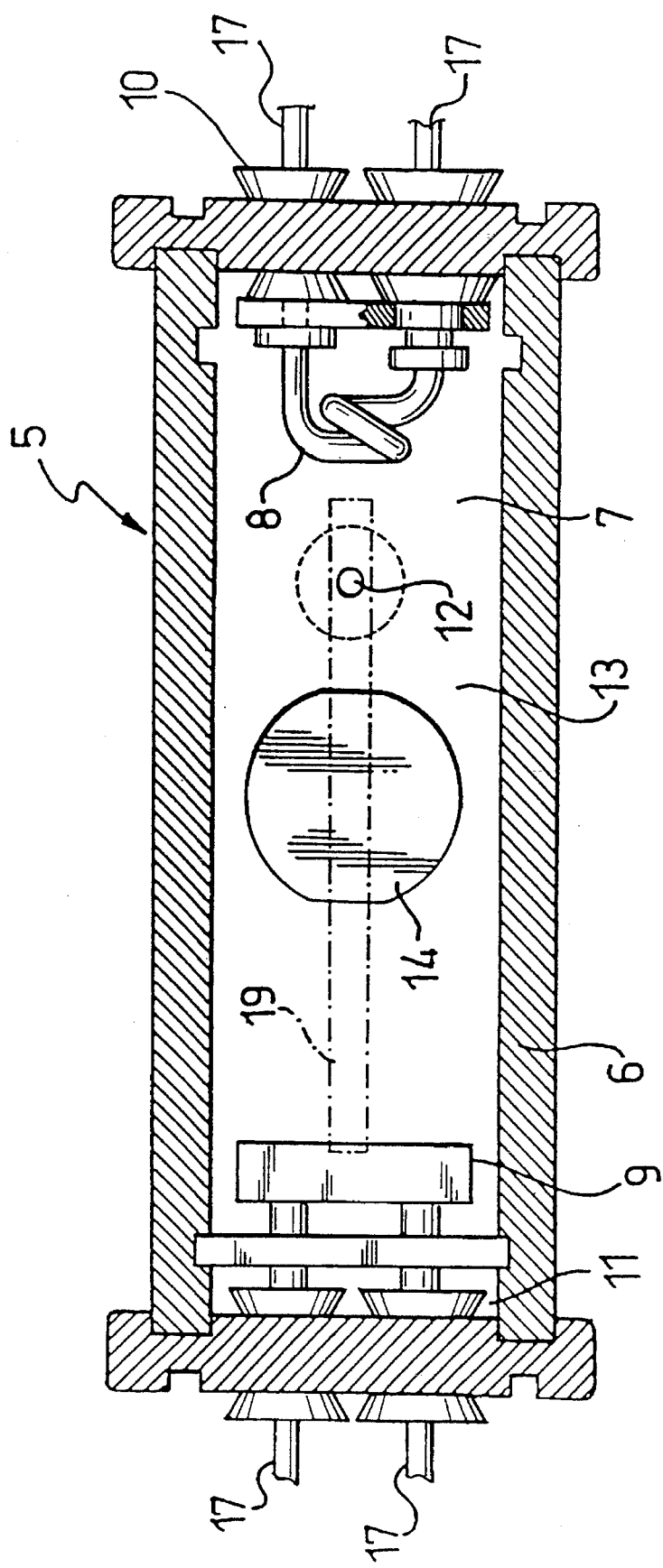
FIG. 2 is a top plan view showing schematically and in cross-section the ionization unit of the generator in FIG. 1.

In the drawings, generally shown at 1 is a generator of an aluminum ion stream, particularly for aluminum ion implantation in the microelectronics industry. The generator 1 comprises a holding frame 2 formed with a flange 3 carrying a seal 4 for vacuum-tight closure.

Mounted on the frame 2 is an ionization unit 5 having metal walls 6 which bound an ionization chamber 7. The ionization unit 5 comprises an electrode 8 and a repel plate 9 which are supported inside the ionization chamber 7 on the walls 6 through respective insulator pairs 10 and 11; the electrode 8 and plate 9 are located within the ionization chamber 7 on opposite sides from each other.

The generator 1 includes an ionization gas inlet line 12 to the ionization chamber 7 which is supported on the frame 2 and open up to a central area 13 of the ionization chamber 7.

The ionization unit 5 further includes a plate 14 of a feed material, being removably attached to the wall 6 inside the ionization chamber 7, in the central area 13 of the latter. The plate 14 may be secured in any of several ways, such as by providing the plate integrally with a threaded stud 15 for screwing into a mating threaded socket formed in the wall 6.

The generator 1 includes means for supplying the necessary electric currents and voltages. Of such means, known per se, only sections of leads 17 and two connection plates 18 are shown in the drawings.

The walls 6 of the ionization unit 5 are formed with a plasma take-out opening 19 which communicates the ionization chamber 7 to a selection path 20. A positively biased take-out plate 21 is placed opposite to the opening 19. A window 22 is provided in the path 20.

The selection path 20 extends through a magnetic field conventionally generated by means not shown.

Preferably, the ionization gas employed is silicon tetrafluoride, $SiF_4$, and the feed material is alumina, $Al_2O_3$; the electrode 8 is made of tungsten and supplied with currents on the order of 100 to 400 A; the walls 6 of the ionization unit 5 are made of stainless steel, as are the line 12 and frame 2; the walls 6 are biased positively with respect to the electrode 8 by a voltage on the order of 50 to 200 V; and the repel plate 9 is biased negatively by a voltage on the order of 50 to 200 V.

The generator 1 is operated as follows.

The electrode 8, being powered as mentioned above, will produce an electron flow inside the ionization chamber 7; the electrons are accelerated by the positive bias of the walls 6 with respect to the electrode 8.

The ionization gas—silicon tetrafluoride, $SiF_4$—introduced into the ionization chamber over the line 12 will be bombarded by the electron flow and become ionized. Thus, a plasma is formed which comprises ions $F^+$, $Si^+$, $Si^{++}$, $SiF^+$, $SiF_2^+$, $SiF_3^+$ and is confined within the central area 13 of the ionization chamber by the repulsive action of the negatively biased plate 9.

This plasma is at a very high temperature, on the order of 1500° C., and will attack chemically the feed material of $Al_2O_3$. As a result of this attack, the feed material of $Al_2O_3$ splits to release aluminum ions which will join the plasma. Such ions mainly have a charge of one, two or three, according to the energy input level; at the current and voltage values specified above, ions $Al^+$ will prevail.

By means of the take-out plate 21, as biased negatively by a voltage on the order of 50–100 kV, the plasma is pulled out of the ionization chamber 7 and injected into the selection path 20. Along this path, which is quite similar to a mass spectrometer and operates on the same principle, the various ions present in the plasma will undergo a deflection. The greater is the charge and the smaller the weight, the greater the deflection, that is the deflection increases as the equivalent weight decreases, which weight represents the weight-to-charge ratio, as previously specified.

Since the aluminum ions $Al^+$ are the only ions present in the plasma which have an equivalent weight of 27, such ions can be isolated from the remainder of the plasma to obtain a stream of just aluminum ions, as intended. For this purpose, it will suffice that the strength of the magnetic field in the selection path 20 be adjusted to only pick up from the window 22 ions with an equivalent weight of 27.

Where a stream of ions $Al^{++}$ or $Al^{+++}$ is sought, additionally to providing a greater energy input both through the power supply to the electrode and the biasing of the walls 6 with respect to the electrode 8, the strength of the magnetic field in the path 20 should be such as to pick up, from the window 22, ions with equivalent weights of 13.5 and 9, respectively.

The stream of aluminum ions to be obtained with this invention is a highly pure one and has great strength. Accordingly, it can be used directly in operations of the microelectronics industry involving aluminum ion implantation.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for producing a stream of ionic aluminum, particularly intended for aluminum ion implantation in the microelectronics industry, comprising the steps of:

supplying a stream of an ionization gas into an ionization chamber;

providing an amount of an aluminum-containing feed material inside the ionization chamber;

generating, within the ionization chamber, an electron flow by supplying an electrode with a large current;

bombarding the ionization gas stream with the electron flow to create a plasma;

causing the plasma to attack the feed material so as to become enriched with aluminum ions;

taking the plasma out of the ionization chamber;

removing from the plasma, by application of a magnetic field, those ions which have a significantly different equivalent weight from the equivalent weight of the aluminum ions;

wherein the ionization gas and the feed material are selected to produce ions having a significantly different equivalent weight from an equivalent weight of the aluminum ions.

2. A method according to claim 1, wherein the feed material is alumina, $Al_2O_3$.

3. A method according to claim 1, wherein the ionization gas is silicon tetrafluoride, $SiF_4$.

4. A method according to claim 1, further comprising the step of:

concentrating the plasma at the aluminum-containing feed material inside the ionization chamber.

5. A method according to claim 1, further comprising the step of:

accelerating the electron flow by biasing the walls of the ionization chamber positively with respect to the electrode.

6. A generator of an aluminum ion stream, particularly for aluminum ion implantation in the microelectronics industry, comprising:

an ionization unit;

an ionization chamber within the ionization unit;

a plate of a feed material removably supported inside the ionization chamber;

an ionization gas inlet line, for introducing an ionization gas into the ionization chamber, the ionization gas and the feed material having a molecular composition such that a mixture of ions having different equivalent weights from that of an aluminum ion is produced when the feed material is exposed to the ionization gas;

an electrode facing into the ionization chamber and adapted to be supplied a sufficiently large current to cause ionization of the substances present in the ionization chamber and consequent formation of a plasma;

an opening for taking the plasma out of the ionization chamber; and a selection path for the plasma thus taken out, extending through a magnetic field to separate ions with different equivalent weights within the plasma.

7. A generator according to claim 6, further comprising a negatively biased repel plate mounted inside the ionization chamber on the remote side thereof from the electrode, the feed material, located in a central area of the ionization chamber between the electrode and the repel plate.

8. A generator according to claim 6, wherein the feed material is alumina, $Al_2O_3$.

9. A generator according to claim 6, wherein the ionization gas is silicon tetrafluoride, $SiF_4$.

* * * * *